United States Patent [19]

King et al.

[11] Patent Number: 5,262,715
[45] Date of Patent: Nov. 16, 1993

[54] ARRANGEMENT FOR THE MEASUREMENT OF REACTIVE POWER OR REACTIVE ENERGY

[75] Inventors: Martin King, Zug; Reinhard Döbele, Steinhausen; Ruedi Raschle, Wädenswil, all of Switzerland

[73] Assignee: Landis & Gyr Betriebs AG, Zug, Switzerland

[21] Appl. No.: 911,894

[22] Filed: Jul. 10, 1992

[30] Foreign Application Priority Data

Jul. 22, 1991 [CH] Switzerland .................. 02183/91

[51] Int. Cl.⁵ .................. G01R 11/16; G01R 21/06
[52] U.S. Cl. .................. 324/141; 324/107; 324/142; 364/483
[58] Field of Search .................. 324/107, 141, 147; 328/160; 364/483, 487, 843, 844, 481; 307/512, 262

[56] References Cited

U.S. PATENT DOCUMENTS

| | | | |
|---|---|---|---|
| 3,639,847 | 2/1972 | Remy et al. ................. | 328/160 |
| 3,984,737 | 10/1976 | Okamura et al. ............. | 364/492 |
| 4,086,540 | 4/1978 | Delagrange ................. | 328/160 |
| 4,131,847 | 12/1978 | Kohga et al. ............... | 324/141 |
| 4,589,074 | 5/1986 | Thomas et al. .............. | 364/483 |
| 4,594,547 | 6/1986 | Halder ...................... | 324/141 |
| 4,620,157 | 10/1986 | Hayashi ..................... | 324/141 |
| 4,663,587 | 5/1987 | Mackenzie .................. | 324/142 |
| 4,788,619 | 11/1988 | Ott et al. .................. | 364/483 |
| 5,017,860 | 5/1991 | Germer et al. ............... | 324/141 |

FOREIGN PATENT DOCUMENTS

| | | | |
|---|---|---|---|
| 0003049 | 1/1982 | Japan .................. | 324/141 |
| 0150349 | 8/1984 | Japan .................. | 324/141 |
| 0186863 | 8/1986 | Japan .................. | 324/141 |

*Primary Examiner*—Vinh Nguyen
*Attorney, Agent, or Firm*—Meltzer, Lippe, Goldsteinn

[57] ABSTRACT

A circuit is disclosed for measuring reactive energy or reactive power. The circuit comprises a main multiplier, a signal/frequency converter, and a frequency divider all connected in series to form a cascade circuit having an output connected to a display. A 90° phase shifter has an input for receiving a first signal component (e.g., alternating voltage) of the reactive energy or power. A second signal component (e.g., alternating current) is connected to a second input of the main multiplier. The phase shifter has a frequency dependent transfer function $K[f]$. In order to eliminate the effect of this transfer function on the measurement of reactive power or reactive energy, the arrangement includes a frequency measurement circuit for measuring the frequency of the first signal component and a frequency/signal converter for generating an output signal dependent on $K[f]$. The output signal of the frequency/signal converter is connected to an input of the cascade circuit so that the frequency dependence of the phase shifter is eliminated from the output of the cascade circuit.

6 Claims, 1 Drawing Sheet

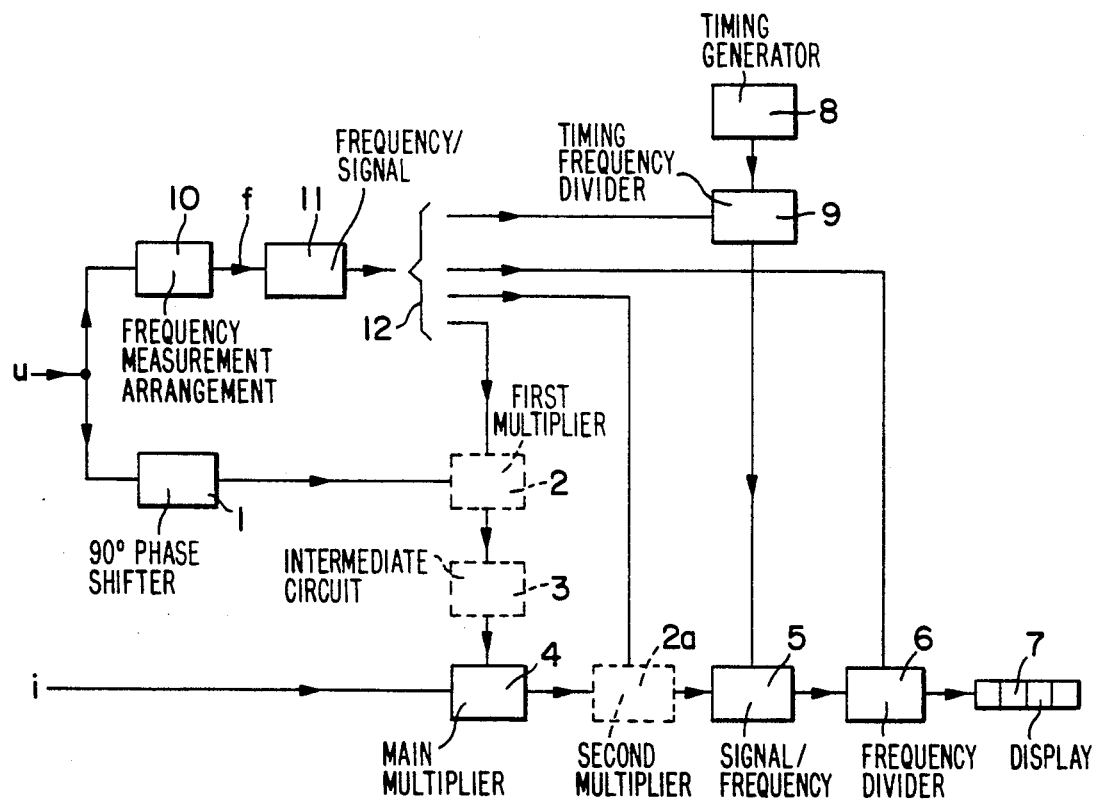

ARRANGEMENT FOR THE MEASUREMENT OF REACTIVE POWER OR REACTIVE ENERGY

FIELD OF THE INVENTION

The invention relates to an arrangement for measuring reactive power or reactive energy (idle power or idle energy). The arrangement for measuring the reactive energy is by preference a reactive energy Watt-hour meter. The arrangement for measuring the reactive power is e.g. the input section of such a reactive energy Watt-hour meter.

An arrangement for measuring reactive power or reactive energy is known from EP 0,266,488 A1, and includes among other things a 90° phase shifter.

In theory it is ideally usually assumed that the output signal of the 90° phase shifter is independent of frequency. In contrast therewith, the output signal of 90° phase shifters used in practice is usually frequency dependent. Hence, any reactive power or reactive energy that is being measured with such a phase shifter becomes a function of the frequency of the alternating voltage associated with said reactive power or reactive energy. As a result, the accuracy of such an arrangement is vitiated when the frequency undergoes large fluctuations. This is e.g. often the case for voltages being supplied by power utilities.

OBJECT OF THE INVENTION

The object of the invention is to improve the arrangement described above in which the result of the measurement can be made independent of the frequency of the electric alternating voltage. A greater accuracy of measurement can then be obtained, especially when frequency fluctuations occur.

SUMMARY OF THE INVENTION

The object of the invention is achieved by inserting circuit elements in the path preceding or following the conventional multiplication of voltage and current. More specifically a 90° phase shifter is introduced whose transfer function is being determined. The value thereof or its reciprocal is multiplied appropriately by said circuit elements in a manner to cancel any adverse frequency dependence.

BRIEF DESCRIPTION OF THE DRAWINGS

Examples of particular embodiments of the invention are shown in the single drawing and are further described below.

DETAILED DESCRIPTION

The single drawing of the figure indicates four embodiments of the arrangement according to the invention. The arrangements according to the invention includes a 90° phase shifter 1, an optional first multiplier arrangement 2, an optional second multiplier arrangement 2a, an optional intermediate circuit 3, a main multiplier 4, a signal/frequency converter 5, a timing frequency divider 9, a frequency measurement arrangement 10 and a frequency/signal converter 11 In the arrangement according to the invention, first multiplier arrangement 2 is available in a first embodiment, and the second multiplier arrangement 2a is available in a fourth embodiment.

The two multiplier arrangements 2 and 2a each comprise e.g. a Hall element, an operations-transconductance-amplifier (OTA) or a digital multiplier element.

Main multiplier 4 comprises e.g. a pulse amplitude modulator (PAM), a Hall element having a current loop or an operations-transconductance-amplifier (OTA). When a PAM is used, intermediate circuit 3 is a mark-space modulator. If an OTA is used for main multiplier 4, intermediate circuit 3 becomes superfluous and is thus unavailable. If, on the other hand, main multiplier 4 is a Hall element, then intermediate circuit 3 is a voltage-/current-converter and comprises by preference a series resistance connected to the input of main multiplier 4.

The input terminals to phase shifter 1 and to the frequency measurement arrangement 10 are supplied by a signal representing a first component (first signal) associated with the reactive power or reactive energy. In a first variant of the first embodiment indicated in the figure, the output of phase shifter 1 is connected to a first terminal of main multiplier 4 through first multiplier arrangement 2 and through intermediate circuit 3 (if the latter is available). If intermediate circuit 3 is not available, the connection is made directly through first multiplier arrangement 2. The second input terminal of main multiplier 4 is supplied by a signal representing a second component (second signal) associated with the reactive power or reactive energy. When the first signal is the alternating voltage u associated with the reactive power or reactive energy, the second signal is the alternating current i associated herewith. Alternatively, voltage u and current i can be interchanged. For the case at hand, multiplier arrangement 2 and intermediate circuit 3 (if available) are connected in cascade in the indicated sequence. In a second variant of the first embodiment, first multiplier arrangement 2 is inserted in front of main multiplier 4. The output of phase shifter 1 is then either directly connected to the first input terminal of main multiplier 4, or through intermediate circuit 3.

Main multiplier 4, second multiplier arrangement 2a (if available), signal/frequency converter 5 and frequency divider 6 are connected in cascade in the sequence enunciated, in order to create a first cascade circuit 4; 5; 6 or a second cascade circuit, 4; 2a; 5; 6 whose output signal is connected to display 7. The output signal of main multiplier 4 is known to be proportional to the reactive power. In the first three embodiments it is converted by signal/frequency converter 5 into a sequence of rectangular pulses of a frequency proportional to the input frequency. The frequency is further divided by a programmable value in frequency divider 6. The output pulses of frequency divider 6 are finally counted and displayed on display 7.

As mentioned before, 90° phase shifter 1 has as a rule a transfer function (which will hereinafter be designated by K[f]) that is a function of the frequency of alternating voltage u. If no remedial measures are taken, the displayed signal of cascade circuit 4; 5; 6 or 4; 2a; 5; 6 is also a function of frequency.

Timing generator 8 is connected to the input of a timing signal of signal/frequency converter 5 via timing frequency divider 9. Frequency measurement 10 and frequency/signal converter 11 are connected in cascade in the sequence indicated.

Frequency measurement arrangement 10 serves the purpose of measuring the frequency of alternating voltage u and includes e.g. a cascade circuit of a comparator (not shown), which converts the sinusoidal alternating voltage u into rectangular pulses. A pulse counter connected thereto counts the number of rectangular pulses. The output signal of frequency measurement arrangement 10, and therefore also the input signal of frequency/signal converter 11 are at any given time proportional to the measured values of the frequency f. As to frequency/signal converter 11, in the second and third embodiment it has an output signal which is proportional to the frequency dependent transfer function K[f] of 90° phase shifter 1.

In the first and fourth embodiment, it has an output signal which is inversely proportional to said transfer function. Frequency/signal converter 11 includes by preference a read-only memory (ROM), in which are stored in tabular form the values 1/K[f], or K[f] (as the case may be), associated with each measured frequency f of the alternating voltage u.

In all four embodiments of the arrangement according to the invention, the output of frequency/signal converter 11 is connected to appropriate input terminals of the elements forming cascade circuit 4; 5; 6 or 4; 2a; 5; 6 respectively, in such a manner that the output signal of these circuits is independent of the frequency f of alternating voltage u. In the drawing, the four embodiments are symbolically represented by curled brackets as a way of indicating that the output of frequency/signal converter 11 is connected to the embodiment at hand, viz. the appropriate input terminal of first multiplier arrangement 2, second multiplier arrangement 2a, frequency divider 6, or signal/frequency converter 5.

In the first embodiment, the terminal of cascade circuit 4; 5; 6 that is to be connected to frequency/signal converter 11 is one of the two input terminals of main multiplier 4. By preference, the connection to main multiplier arrangement 4 is made via first multiplier arrangement 2, inasmuch as the latter is available in the embodiment at hand. A second input terminal of the latter is furthermore connected to the output of 90° phase shifter 1. In such a fashion, first multiplier arrangement 2 multiplies the output of 90° phase-shifter (which is proportional to K[f]) by the output signal of frequency/signal converter 11 (which is proportional to 1/K[f] in the first embodiment). Consequently, the output signal of first multiplier arrangement 2 and with it also the output signal of first cascade circuit 4; 5; 6 is frequency independent, since the factor K[f] has been eliminated owing to the multiplication operation.

In a second embodiment of the arrangement according to the invention, the manner in which the output of frequency/signal converter 11 is connected to a particular input terminal of an element belonging to first cascade circuit 4; 5; 6, is achieved by connecting this output to a programmable input of frequency divider 6. The output signal of multiplier 4, which, in the second embodiment, is proportional to the output signal of 90° phase-shifter 1 and is therefore also proportional K[f], is converted into a pulse sequence proportional to frequency in signal/frequency converter 5. This signal, which appears at the input terminal of frequency divider 6 is also proportional to K[f]. The signal appearing at the programmable input of frequency divider 6, i.e., the signal that is the output signal of frequency/signal converter 11 in the second embodiment, determines the value by which frequency divider 6 divides its input frequency. In the second embodiment, the programmed value of frequency divider 6 is exactly proportional to K[f] as is the input frequency of frequency divider 6. Consequently, the factor K[f] in frequency divider 6 has been eliminated as a result of the frequency division, and the output signal of first cascade circuit 4; 5; 6 is frequency independent.

In a third embodiment of the arrangement according to the invention, the manner in which the output of frequency/signal converter 11 is connected to a particular input terminal of an element belonging to first cascade circuit 4; 5; 6 is achieved by connecting the output of frequency/signal converter 11 to an input of timing frequency divider 9. In the third embodiment, the programmable value is proportional to 1/K[f]. The output frequency of the pulse sequence appearing at the output of signal/frequency converter 5 results from the influence of two different channels. In the first channel there is the output signal of main multiplier 4 which is proportional to K[f] as in the second embodiment. In the second channel, the output frequency of timing frequency divider 9 leads to a signal that is proportional to 1/[K(f)], thereby, eliminating the factor K[f] coming from the first channel. Consequently, the output signal of first cascade circuit 4; 5; 6 is independent of frequency.

In the fourth embodiment of the arrangement according to the invention, the second multiplier arrangement 2a is available, whose output signal is converted in signal/frequency converter 5 into a pulse sequence having a rate proportional to the frequency. In this embodiment the manner in which the output of frequency/signal converter 11 is connected to a particular input terminal of an element belonging to second cascade circuit 4; 2a; 5; 6 is achieved by connecting it to a first terminal of second multiplier arrangement 2a. The second input terminal of the latter serves the purpose of creating second cascade circuit 4; 2a; 5; 6. The output signal of multiplier 4 which is proportional to K[f] (as in the second embodiment) is multiplied in the second multiplier arrangement 2a, by the output signal of frequency/signal converter 11. This output signal is proportional to 1/K[f] in the fourth embodiment, so that the output signal of second multiplier arrangement 2a is independent of frequency since the factor K[f] is eliminated as a result of the multiplication. The same applies to the output signal of second cascade circuit 4; 2a; 5; 6 which is hereby rendered independent of frequency.

In all four embodiments of the arrangement according to the invention the output signal of either first cascade circuit 4; 5; 6 or second cascade circuit 4; 2a;5; 6 is being made independent of frequency. Consequently, the result of a measurement of the arrangement is also independent of frequency, and the accuracy of the measurement of the arrangement is no longer vitiated by the values of frequency f.

Finally, the embodiments of the invention described in the foregoing are merely illustrative. Clearly, several alternative embodiments could be readily devised from the spirit and scope of the claims set forth hereinunder.

We claim:

1. An arrangement for measuring a reactive energy or reactive power comprising a main multiplier with first and second inputs, a signal/frequency converter, and a frequency divider all connected in series, to form a cascade circuit having at least one input and an output connected to a display, a 90° phase shifter with a frequency dependent transfer function K having an input for receiving a first signal component of said reactive energy or reactive power, and having an output in communication with said first input of the main multiplier, said second input of the main multiplier receiving a second signal component of the reactive energy or reactive power,
a frequency measurement circuit for measuring the frequency f of said first signal component, and
a frequency/signal converter connected to said frequency measurement circuit for outputting at an output an output signal which is proportional or inversely proportional to K, said output of said frequency/signal converter being in communication with said at least one input of said cascade circuit so that a signal generated at said output of said cascade circuit is independent of the frequency f of the first component signal.

2. The arrangement of claim 1 wherein one input of the main multiplier is said input of the cascade circuit with which said output of said frequency/signal converter is in communication, and wherein the output signal of the frequency/signal converter is proportional to the inverse of the transfer function K.

3. The arrangement of claim 2 wherein the output of the frequency/signal converter is in communication with an input of said cascade circuit via a path including a first multiplier whose first input is connected to the output of the frequency/signal converter, whose second input is connected to the output of the phase shifter and whose output is connected to said one of the inputs of the main multiplier.

4. The arrangement of claim 1 wherein the frequency divider is programmable to divide by a factor determined by a signal present at a program input, wherein the output of the frequency/signal converter is connected to said program input, and wherein the output signal of the frequency/signal converter is proportional to the transfer function K.

5. The arrangement of claim 1 further comprising a timing generator and a timing frequency divider connected to the timing generator, said output of the frequency/signal converter being connected to said at least one input of said cascade circuit via a path including said timing frequency divider, whereby the output of the frequency/signal converter is connected to a programmable input of the timing frequency divider and an output of the timing frequency divider is connected to an input of the signal/frequency converter of the cascade circuit, and wherein the output of the frequency/signal converter is proportional to the transfer function K of the phase shifter.

6. The arrangement of claim 1 wherein
said cascade circuit comprises a second multiplier connected between an output of said main multiplier and an input of said signal/frequency converter of said cascade circuit,
said output of said frequency/signal converter being connected to an input of said second multiplier of said cascade circuit,
said output signal of said frequency/signal converter being inversely proportional to said transfer function K.

* * * * *